US005568577A

United States Patent [19]
Hardy, Jr. et al.

[11] Patent Number: 5,568,577
[45] Date of Patent: Oct. 22, 1996

[54] METHOD AND APPARATUS FOR CONCENTRATING THE ENERGY OF LASER DIODE BEAMS

[75] Inventors: Arthur H. Hardy, Jr., Santa Barbara; Leland V. Gardner, Buellton, both of Calif.

[73] Assignee: Hughes Electronics, Los Angeles, Calif.

[21] Appl. No.: 355,878

[22] Filed: Dec. 13, 1994

[51] Int. Cl.⁶ ................................................ G02B 6/32
[52] U.S. Cl. .................................................... 385/33
[58] Field of Search .............................. 385/33, 31, 900, 385/47, 146

[56] References Cited

U.S. PATENT DOCUMENTS

| | | | |
|---|---|---|---|
| 4,325,633 | 4/1982 | Gardner | 356/141 |
| 4,479,697 | 10/1984 | Kapany et al. | 385/33 |
| 4,634,215 | 1/1987 | Reule | 385/33 |
| 4,675,860 | 6/1987 | Laude et al. | 385/33 |
| 4,688,884 | 8/1987 | Scifres et al. | |
| 4,934,784 | 6/1990 | Kapany et al. | 385/33 |
| 5,080,706 | 1/1992 | Snyder et al. | 65/102 |
| 5,127,068 | 6/1992 | Baer et al. | 385/34 |
| 5,155,354 | 10/1992 | Hardy, Jr. et al. | 250/216 |

FOREIGN PATENT DOCUMENTS 61-272707  4/1987  Japan .

OTHER PUBLICATIONS

IBM Technical Disclosure Bulletin, vol. 34, No. 10A, 1 Mar. 1992, pp. 264–265, "Efficient fiber coupler using an ellipsoidal reflector".

Optical Engineering, vol. 33, No. 11, 1 Nov. 1994, pp. 3662–3669, Weiqun Chen et al. "Design approaches for laser–diode material–processing systems using fibers and micro–optics".

*Primary Examiner*—John Ngo
*Attorney, Agent, or Firm*—Charles D. Brown; Wanda K. Denson-Low

[57] ABSTRACT

Methods and apparatus are disclosed for concentrating the energy of laser diode beams by imaging them to obtain a superimposed image and a combined numerical aperture at a focal plane and by guiding them between reflective boundaries to maintain a lesser second numerical aperture at the focal plane. The combined numerical aperture preferably matches the second numerical aperture so that the energy can be received into the entrance end of optical fibers whose numerical apertures also match the second numerical aperture. A described embodiment utilizes collimating lenses and an off-axis parabolic reflector. The exit ends of the optical fibers can be grouped and fractionally magnified into a concentrated energy pattern. The final image can be imposed into a single optical fiber for passage along remote or convoluted optical paths.

44 Claims, 5 Drawing Sheets

METHOD AND APPARATUS FOR CONCENTRATING THE ENERGY OF LASER DIODE BEAMS

BACKGROUND OF THE INVENTION

1. Field of the Invention

The present invention relates generally to laser beams and more particularly to methods and apparatus for concentrating the energy of laser diode beams.

2. Description of the Related Art

Semiconductor laser diodes have a very small emitting aperture (typically about one micron by 200 microns) that is in the same plane as their diode junction. They also have a considerably greater beam divergence (the angle between opposite beam edges) than other lasers. A typical divergence parallel to the diode junction (the "slow plane") is 10 degrees and a typical divergence normal to the diode junction (the "fast plane") is 40 degrees. In relation to its own propagation axis, a laser diode beam can be said to define a numerical aperture along a slow axial beam plane (initially, the junction plane) and a greater numerical aperture along a fast axial beam plane (initially, orthogonal to the diode plane).

Multiple laser diodes are fabricated in bars and arrays which can contain hundreds of spaced diodes which produce a considerable total output power, e.g., 20–30 watts. Even though laser diodes are efficient, the removal of dissipated power is an important issue in such structures.

If the laser diode output is to be used in a fiber optic system, the laser diode's active light-emitting aperture must be coupled to the light-carrying core of the optical fiber. Because optical fiber cores and the laser diode's light-emitting aperture are both measured in microns, precise mechanical alignment becomes critical. Coupling techniques typically involve the use of short focal length microlenses because of the high divergence of laser diode beams and the small diameter of optical fibers.

For example, U.S. Pat. No. 5,127,068 describes an apparatus for coupling a multiple emitter laser diode to a multimode optical fiber. It includes the use of a cylindrical microlens, such as a small diameter optical fiber, to collimate the laser diode output emissions. The collimation is performed in the high divergence axis of the laser diode, and the diameter of the optical fiber used as the microlens is chosen to roughly equal that of the coupled fiber.

In an embodiment described in the patent, an optical fiber array is coupled to a diode bar having a plurality of spaced laser diode emitters. Each fiber of the fiber array is spaced to match the diode spacing of the diode bar, and the microlens optical fiber is arranged between the diode bar and the fiber array and oriented to extend along the length of the laser diode bar. The fibers of the array have a 250 micron diameter. The microlens is also a 250 micron diameter fiber, spaced approximately 50 microns from the laser diode emitting surface and about 300 microns from the ends of the coupled optical fibers. Spacings this small present difficult alignment problems but are necessary because of the short focal length microlens dictated by the coupling structure. The described coupling structure also requires that a separate output optical fiber be added for each additional laser diode in the diode bar.

When used as a cylindrical lens, an optical fiber having a circular cross section provides a circular focusing shape. U.S. Pat. No. 5,080,706 describes a method of forming cylindrical microlenses having other optically desirable focusing shapes, e.g., elliptical and hyperbolic. These shapes offer better focusing properties but such cylindrical microlenses must still have very short focal lengths when used to focus laser diode beams.

The characteristics of parabolic and elliptical reflecting surfaces are well known in the optical art. A first example of the use of an off-axis parabolic or elliptical reflecting surface, i.e., an asymmetric portion of a parabolic or elliptical shape, to focus electromagnetic radiation is disclosed in U.S. Pat. No. 4,325,633. A second example is disclosed in U.S. Pat. No. 5,155,354 which is assigned to Santa Barbara Research Center, the assignee of the present invention.

SUMMARY OF THE INVENTION

The present invention is directed to methods and apparatus for concentrating the energy of electromagnetic beams that have non-constant numerical apertures. An exemplary beam is a laser diode beam which defines a first numerical aperture and a lesser second numerical aperture respectively along first and second axial beam planes.

These goals are realized with the recognition that if these beams are arranged so that their first axial beam planes are substantially parallel and their second axial beam planes are substantially parallel, the beams can be imaged along their fast axial beam planes to a superimposed image and a combined numerical aperture at a focal plane while they are guided along their slow axial beam planes to maintain their second numerical aperture at the focal plane. It is recognized that if the combined numerical aperture substantially matches the second numerical aperture, the beams can be received at the focal plane into entrance ends of optical fibers whose efficiency is increased by matching their numerical apertures also to the second numerical aperture. The packing efficiency of the optical fibers is also increased by matching their cross-sectional dimensions with the image size produced at the focal plane by these functional steps.

It is also recognized that the energy of the beams can be further concentrated by grouping the exit ends of the intermediate fibers together into a compact pattern. The fibers, either singly or in an array, can be imaged at fractional magnification by a relay lens. A realizable reduction would be about 7.2 times which would give an area reduction of 52 times that of the fiber or fiber array. If desired, this concentrated energy pattern can be imposed on the end of an optic fiber of matching, or greater, dimensions and numerical aperture, and transmitted through the fiber along a selected path. Typical applications of this concentrated energy include internal photo catheterization, photo dynamic therapy, welding, soldering, and marking.

In a preferred embodiment, a coupler is formed that includes lenses arranged to reduce the first numerical aperture and direct the beams to an off-axis parabolic reflecting surface which directs the beams to a focal plane. The embodiment has clad walls which are spaced at each side of the focal plane to direct the beams along their slow divergence planes to the focal plane.

In another preferred embodiment, a coupler is formed that includes an off-axis elliptical reflecting surface which directs the beams to a focal plane. A second off-axis elliptical reflecting surface is arranged to share a far focus with the first surface to obtain superimposed images at a common focal plane.

The novel features of the invention are set forth with particularity in the appended claims. The invention will be

DESCRIPTION OF THE PREFERRED EMBODIMENTS

Figures 1, 2A, 2B, 2C:
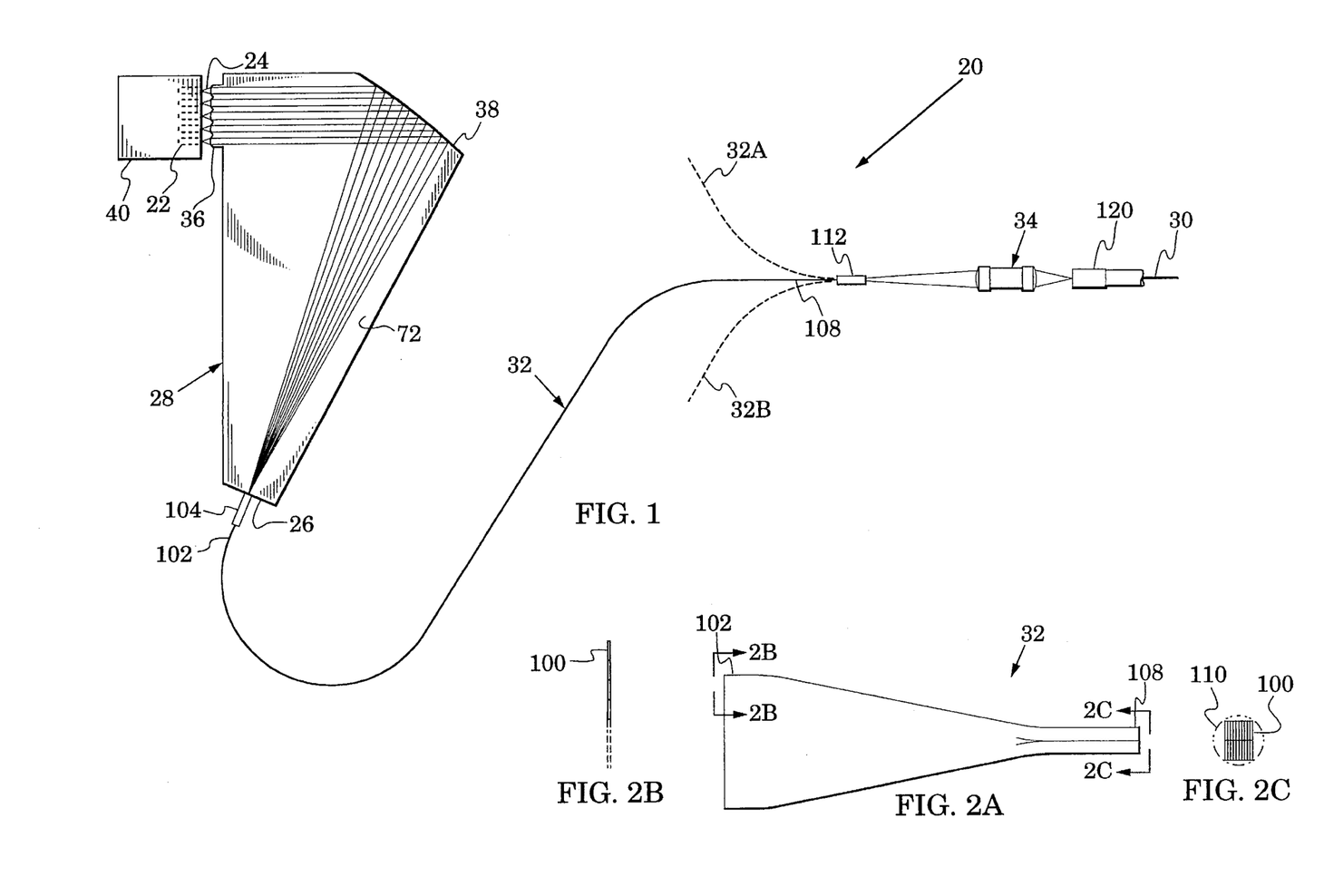
FIG. 1 is an elevation view of a preferred optical system embodiment, in accordance with the present invention, that concentrates the emissions of a plurality of laser diodes into an output optical fiber.
FIG. 2A is a schematized plan view of a ribbon fiber assembly in the system of FIG. 1.
FIG. 2B is an enlarged fragmentary view along the plane 2B—2B of FIG. 2A.
FIG. 2C is an enlarged view along the plane 2C—2C of FIG. 2A.

FIG. 1 is a side elevation view of a preferred optical system embodiment 20 that concentrates the laser beam energy from a plurality of laser diode bars 22 by superimposing their images. In particular, the system 20 first images and guides the laser beams 24 of the diode bars 22 onto the focal plane 26 of an optical coupler 28, and, secondly, directs the energy at the focal plane 26 into an output optical fiber 30 with the aid of a ribbon fiber assembly 32 and an imaging lens 34.

The optical coupler 28 includes a plurality of cylindrical lenses 36 (a cylindrical lens is one having a constant optical cross-section along a longitudinal axis) and a parabolic mirror 38 which are arranged to image the laser beam divergence along a first diode axis onto the focal plane 26 (a cylindrical lens has a constant optical cross-section along a longitudinal axis). The laser beam divergence is controlled along a second diode axis by total internal reflection within the optical coupler 28 and guided thereby to the focal plane 26. Laser beam energy is then coupled from the focal plane 26, transported along the ribbon fiber assembly 32, and imaged onto the end of the output optical fiber 30. For removal of the heat dissipated by the laser diodes, the diode bars 22 are recessed within a heat sink 40, e.g., a water-cooled, copper or ceramic block.

Thus, the energy produced by all the diodes in the diode bars 22 has been concentrated into the optical fiber 30. This concentrated energy can be guided along small, convoluted paths by the output fiber for delivery onto an area similar in size to the cross-sectional area of the output fiber.

Figures 3, 6:
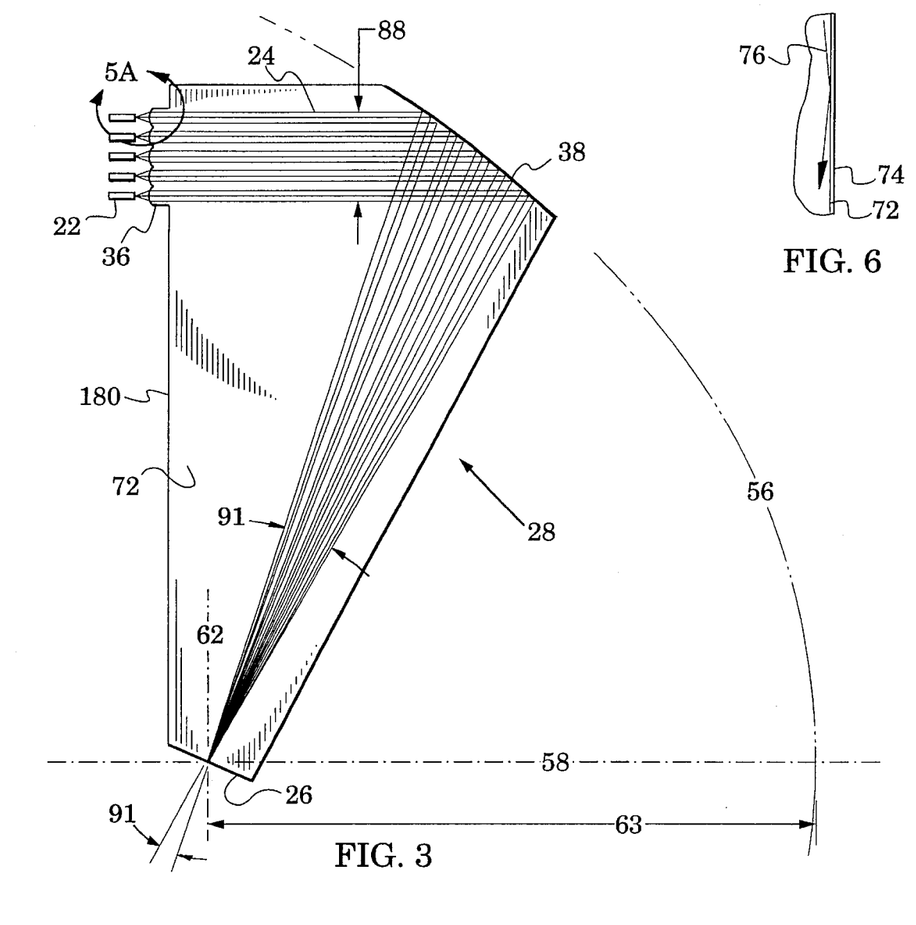
FIG. 3 is a side elevation view of an optical coupler and associated diode bars in the system of FIG. 1.
FIG. 6 is an enlarged view of structure within the curved line 6 of FIG. 4.
Figure 4:
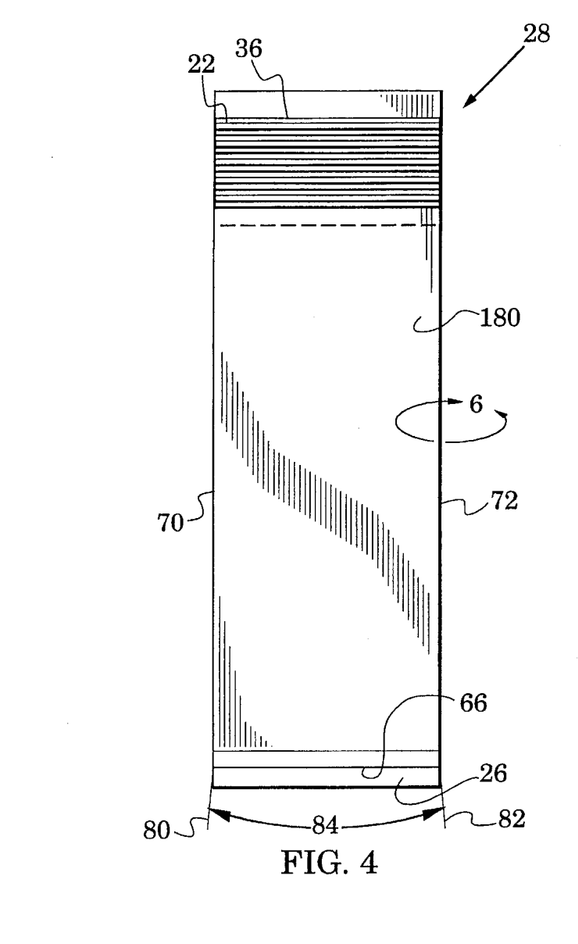
FIG. 4 is a rear elevation view of the structure of FIG. 3.
Figure 5A:
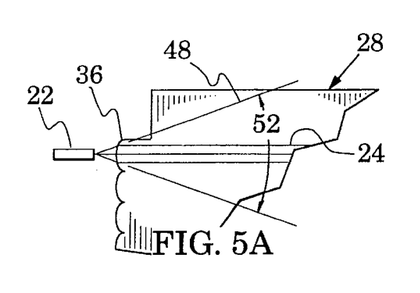
FIG. 5A is an enlarged view of the structure within the curved line 5A of FIG. 3.
Figure 5B:
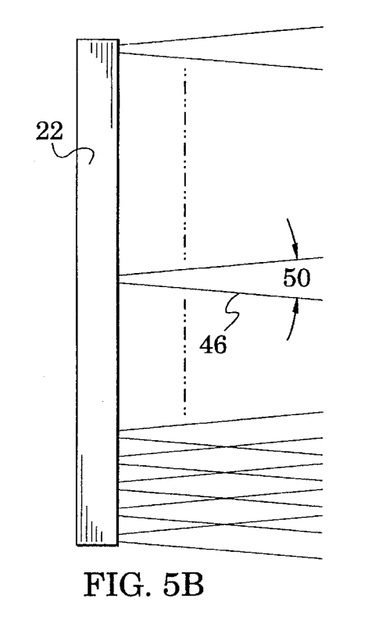
FIG. 5B is a bottom plan view of the diode bar of FIG. 5A.
Figure 5C:
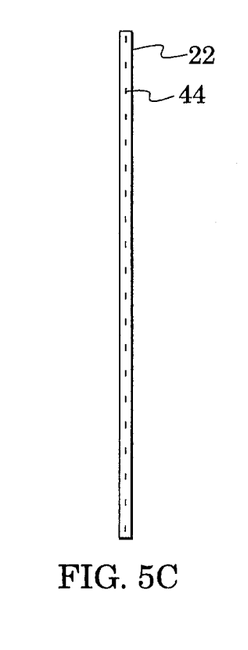
FIG. 5C is a front elevation view of the diode bar of FIG. 5A rotated 90°.

The system 20 can be described with the aid of enlarged views of the principal system components. Accordingly, FIGS. 2A, 2B and 2C are respectively receiving end, side and transmitting end views of the ribbon fiber assembly 32, FIGS. 3 and 4 are respectively enlarged side and rear elevation views of the optical coupler 28, and FIG. 5A is an enlarged view of the lens and diode bar structure within the curved line 5A of FIG. 3. Finally, FIGS. 5B and 5C are respectively bottom plan and front elevation views of the diode bar of FIG. 5A. For clarity of illustration, the heat sink 40 is not shown in FIGS. 3–5.

Detailed attention is first directed to the laser diode bar 22 shown in FIGS. 5A–C. Each of the diode bars 22 includes a plurality of spaced laser emitting apertures 44. Each aperture 44 is the emitting end of an optical resonator whose dimensions are substantially those of the active junction area of a laser diode. Each laser diode in the diode bar 22 emits light along a "slow" axis parallel with the plane of its junction and a "fast axis" that is normal to the plane of its junction. A laser diode's beam generally diverges much more rapidly along the fast axis emission plane than along the slow axis emission plane.

Diode bars are commonly fabricated with the diode junctions spaced along a plane, with the slow axis of each diode junction lying in that plane and the fast axis normal to that plane. Accordingly, the plan view of FIG. 5B shows an emission pattern 46 parallel with the slow axis of each diode in the diode bar 22, while the end view of FIG. 5A shows an emission pattern 48 parallel with the fast axis of each diode. Each laser beam 24 defines a divergence angle 50 along the slow diode axis and a divergence angle 52 along the fast diode axis.

Therefore, when related to its own propagation axis, each laser beam 24 has a divergence angle 50 along a slow axial beam plane and a divergence angle 52 along a fast axial beam plane that is normal to the slow axial beam plane. Exemplary values for the divergence angles 50 and 52 are respectively 10 and 40 degrees. Exemplary rectangular dimensions for the emitting apertures 44 are 1×100 microns with an exemplary diode spacing of 500 microns. An exemplary length of the diode bar 22 is one centimeter.

As seen in FIG. 5A, each diode bar 22 is spaced from a collimating lens 36. The divergence of each laser beam 24 along its fast axial beam plane is reduced by the collimating lens 36 to a divergence angle of substantially zero, i.e., after passing through the collimating lens 36, all rays of each laser beam 24 are substantially parallel in the fast axial beam plane. For clarity of illustration in FIG. 5A, only one of the diode bars 22 is shown.

Attention is now directed to FIG. 3, which illustrates the reflection of each laser beam 24 from a reflecting off-axis parabolic surface 38 of the optical coupler 28. The off-axis parabolic surface 38 is a segment of an parabolic cylinder 56 having an axis 58 that is parallel with the collimated laser beams 24. The focus of the parabolic cylinder 56 is indicated by the intersection of the axis 58 and the broken line 62, and its axial focal length is indicated by the arrow 63. The optical coupler 28 is configured to define a focal plane surface 26 at the focus of the parabolic cylinder 56. Because the laser beams 24 are parallel with the parabolic axis 58, they are focused onto the focal plane 26, i.e., the combination of the collimating lenses 36 and the reflecting surface 38 image the laser beams 24 along their fast axial beam plane to the focal plane 26. As seen in the rear elevation view of FIG. 4, the focused laser beams 24 define an image line 66 on the focal plane 26 where their images are superimposed.

As further shown in FIG. 4, the optical coupler 28 also defines a pair of spaced parallel guide walls 70, 72 that are substantially orthogonal to the slow axial beam plane and oppositely spaced from the fast axial beam plane of the laser beams 24. Therefore, rays of the beams 24 approach these walls at an angle equal to ½ of the slow divergence angle 50 shown in FIG. 5B. The walls 70, 72 each have a cladding whose refractive index is sufficient to obtain total internal reflection of the laser beams 24.

This total internal reflection is illustrated in FIG. 6 which is an enlarged view of the structure within the curved line 6 of FIG. 4. In this figure, an exemplary laser ray 76 is shown reflected inward from a refractive boundary formed by the wall 72 and a cladding 74 carried on the wall 72. As is well known, total internal reflection of the ray 76 will be obtained if its angle of incidence with the wall 72 is greater than a critical angle defined by $\sin^{-1}(n_2/n_1)$, where $n_2$ is the refractive index of the cladding 74 and $n_1$ is the refractive index of the optical coupler's body.

For example, if the coupler 28 is made of glass with a refractive index of 1.6 and the cladding 74 has a refractive index of 1.575 then the critical angle is 80°. In accordance with Snell's Law, the slow axis divergence of the laser beams 24 is altered by the refractive index of the material of the optical coupler 28. That is, one half of the diode slow axis divergence of 10 degrees, shown in FIG. 5B, is changed within the coupler 28 to $\sin^{-1}(\sin 5/1.6) = 3.12$ degrees. The exemplary ray 76 then has an angle of incidence with the wall 72 of 90−3.12=86.88 degrees (angle of incidence with a surface is defined relative to a line orthogonal to the surface). Since this is greater than the critical angle, total internal reflection is obtained and the ray 76 will be reflected away from the wall 72 as shown, i.e., the optical mediums of the wall 72 and cladding 74 form a refractive boundary along their adjoining surfaces. Exemplary cladding materials include silicon dioxide and most epoxies.

Therefore, the refractive boundaries defined by the walls 70, 72 contain the laser beams 24 and guide them along their slow axial beam plane to the focal plane 26. It follows that if the laser beams 24 were allowed to issue into air from the focal plane 26, they would be contained within an envelope defined by the lines 80, 82 in FIG. 4, wherein these lines have an included angle 84 equal to the slow axis divergence angle 50 of FIG. 5B.

Having introduced the structure of FIGS. 1–5C, attention is now directed to the operation of the optical system 20. This operation can best be described with reference to an exemplary system design and that description is facilitated by using the optical concepts of numerical aperture, geometric magnification and the diffraction limit.

Numerical aperture (N.A.) is a measure of the light gathering power of an optical component and is given by N.A.=$n \sin \phi$ where n is the refractive index and $\phi$ is the half angle of the radiation pattern. For example, the numerical apertures of the radiation of the diode beams 24 along slow and fast axial beam planes are simply sine $\phi_s$ and sine $\phi_f$ in which the angles $\phi_s$ and $\phi_f$ are respectively ½ of the divergence angles 50 and 52 in FIGS. 5A–C. This follows because the refractive index of air is one. When applied to optical fibers, numerical aperture represents the angle of acceptance; the largest cone of rays that are accepted for transmission by the fiber. The numerical aperture of optical fibers can be calculated from $\{(b_{cr})^2 - (n_{cd})^2\}^{1/2}$ in which $n_{cr}$ is the refractive index of the fiber core and $n_{cd}$ is the refractive index of the fiber cladding.

In a specular optical system (one in which the laws of reflection and refraction apply), geometric magnification is governed by the sine law which states that the product of image height and numerical aperture is a constant at any stage of the system, i.e., H(n sin $\phi$)=C. It follows that the inverse ratio of image heights at various points along the system is expressed by the ratio of numerical apertures of the components at those points. For example, if $H_i$ and $H_f$ are the image heights respectively at the initial and final components of a system, the geometric magnification of the system is given by $m = H_i/H_f = (n_i \sin \phi_i)/(n_f \sin \phi_f)$.

The diffraction limit is a consequence of the wave character of light which determines the smallest possible image of a point source. This presents a fundamental limitation in instrument resolution, i.e., the sharpness of optical images can never exceed the limits imposed by diffraction. Images that have reached this limit are said to be "diffraction limited". A thin rectangular aperture generates a diffraction pattern consisting of parallel light bars spaced on each side of a central bar. The width from the radiation minimum on one side of the central bar to the minimum on the other side is W=$\lambda$/n sin $\phi$=$\lambda$/N.A., in which $\lambda$ is the radiation wavelength. The energy within this width is approximately 90% of the total beam energy.

In a similar manner, a circular aperture will produce a diffraction pattern having a central spot surrounded by spaced rings. The diameter from the radiation minimum on one side of the central spot to the minimum on the other side is D=1.22$\lambda$/n sin $\phi$=1.22$\lambda$/N.A. The energy within this diameter is approximately 87% of the total beam energy.

In the beginning of the exemplary system design, let a working goal be set of 0.5 for the numerical aperture of the output of the imaging lens 34 in FIG. 1. This is a reasonable goal because optical fibers with a numerical aperture of 0.5 (acceptance angle of 30°) are readily obtainable for use as the output fiber 30 and a 0.5 numerical aperture, diffraction limited lens can be designed for the small field of view and the narrow wavelength band that is involved. The numerical apertures of the laser beams 24 as they enter the system 20 (see FIG. 3 and 5A–C) are sine 5°=0.087 and sine 20°=0.342 for respectively their slow and fast axial beam planes.

It is a transmission property of optical fibers that energy having an entrance numerical aperture less than that of the fiber will expand, with travel through the fiber, to have an exit numerical aperture substantially that of the fiber. Essentially, this means that energy density has been lost with transit through the fiber. Accordingly, for an efficient beam concentrating system, it is preferred that the numerical aperture of the combined laser beams 24 (i.e., the numerical aperture corresponding to the included angle 91 in FIG. 3) is closely matched, at the focal plane 26 in FIG. 1, to the numerical aperture of the ribbon fiber assembly 32. It is also preferred that the width of the ribbon fiber assembly 32 match that of the laser image line (66 in FIG. 3).

Therefore, in accordance with a feature of the present invention, the optical coupler 28 is preferably configured to substantially match the combined fast axial beam plane numerical aperture and the slow axial beam plane numerical aperture at the focal plane 26. Because, the slow axial beam plane numerical aperture is maintained by the spaced refractive walls 70, 72 (see FIGS. 3, 4) as they guide the beams to the focal plane, the numerical aperture in this plane will still be 0.087 at the focal plane 26. The imaging along the fast axial beam plane by the lenses 36 and parabolic mirror 38 is then configured to achieve substantially the same numerical aperture of 0.087 for the combined laser beams 24. In the embodiment 20, this is accomplished by first collimating the beams 24 and then choosing an appropriate focal length of the parabolic mirror 38.

FIG. 3 illustrates that the collimated laser beams 24 from the diode bars 22 are contained within a vertical spacing 88 as they approach the parabolic surface 38, and that the laser beams 24 are contained within an included angle 91 as they impinge upon the focal plane 26. If $n_g$ sine $\phi_f$ is the fast axial beam plane numerical aperture (in which $n_g$ is the refractive index of the glass of the optical coupler 28), then the included angle 91 is twice the half angle $\phi_f$ (similarly, if $n_g$ sine $\phi_s$ is the slow axial beam plane numerical aperture, then the included angle 84 of FIG. 5B is twice the half angle $\phi_s$).

Additional laser diode bars 22 will increase the spacing 88 but it is apparent that a corresponding change in the focal length of the parabolic mirror 38 can maintain the desired fast axial beam plane numerical aperture of 0.087 or, equivalently, the same included angle 91. If the focal length of the collimating lenses 36 is increased, this will also cause the spacing 88 to increase. Again, this can be offset by an appropriate increase in focal length of the parabolic mirror 38. Thus, the teachings of the invention allow the spacing between the laser diode bars 22 and the lenses 36 (see FIG. 3) to be chosen in accordance with reasonable system alignment requirements.

Because the numerical aperture of the laser beams 24 has now been set to 0.087 along both their slow and fast axial beam planes at the focal plane 26, the numerical aperture of the ribbon fiber assembly 32 in FIG. 1 is preferably chosen to have substantially the same numerical aperture. If the numerical aperture of the fiber is greater, the energy numerical aperture will expand to that of the fiber, reducing the ability to fractionally magnify. If it is less, energy will pentrate the cladding and be lost.

The system packing fraction will also be increased if the image size at the focal plane 26 is matched to the cross sectional dimensions of the ribbon fiber assembly. Accordingly, the exemplary system design now addresses image size and diffraction limiting effects at the focal plane 26. Because the images of the laser beams 24 are superimposed at the focal plane, these optical properties are set by each individual beam. For clarity of illustration in FIG. 3, the laser diode bars 22, and hence the beams 24, are spaced apart. In practice, they would be spaced as closely as possible to minimize the vertical spacing 88 as the beams 24 approach the mirror 38. For the exemplary system design, it will be assumed that the edges of the beams 24 adjoin as they approach the mirror 38 and the focal plane 26.

The relationship in the fast axial beam plane between the numerical aperture of the combined beams 24 and the numerical aperture of each beam 24 is $n_g$ sin $\phi_f$=0.087=$n_g$ sin E $\phi_b$, in which $\phi_b$ is the half convergence angle of each beam 24. If the number of combined beams is five as in FIG. 3, then $\phi_b$ is 0.623° and the numerical aperture of each beam is $n_g$ sin (0.623)=0.017. Knowing the numerical aperture of each beam 24, the geometric magnification in the fast axial beam plane of the coupler 28 for each beam can be found from N.A. in/N.A. out=0.342/0.017=20. Since a typical height of the beam emitting aperture 44 in FIG. 5C is 1 micron, the image height at the focal plane 26 will then be 20 microns.

Next, the width of the central bar of the diffraction pattern due to each beam 24 is found from $\lambda/n_g$ sin $\phi_b$=0.7/0.017= 41 microns in which the radiation wavelength is assumed to be 0.7 micron in the near infrared. The power distribution of diffraction limited images in specular optical systems is given by the convolution of the diffraction pattern and the geometrically predicted power distribution. This can be approximated by adding the geometric prediction and the width of the central bar of the diffraction pattern which yields 20+41=61 microns. Therefore, to increase packing efficiency, the height of the fibers in the ribbon fiber assembly 32 should be chosen close to 61 microns.

Finally, the exemplary system design attention is directed to the imaging lens 34 in FIG. 1 and the ribbon fiber assembly 32 as shown in FIGS. 2A–2C. For clarity of illustration, FIG. 2A is a schematized plan view of the ribbon cable assembly 32. FIG. 2B is an enlarged partial view along the plane 2B—2B of FIG. 2A, showing that the assembly 32 includes a plurality of contiguous rectangular optical fibers 100.

The fibers 100 are arranged along a plane to have a total length substantially equal to the length of the image line 66 in FIG. 4. The receiving end 102 of the ribbon fiber assembly 100 is then abutted with the focal plane 26 with a standard fiber fitting 104, as shown in FIG. 1, and the plane of the ribbon fibers 100 is aligned with the image line (66 in FIG. 4) so that the laser beams 24 are received into the ribbon fibers 100. In accordance with the system design calculations above, each of the ribbon fibers 100 preferably has a height of 61 microns and a numerical aperture of 0.087.

In the exemplary system design, it is assumed that the cross-sectional shape of the output optical fiber 30 is circular. For this specific shape, the transmitting ends 108 of the ribbon fiber assembly 32 are preferably arranged to substantially fall within an imaginary circle 110 as shown in FIG. 2C, which is a view along the plane 2C—2C of FIG. 2A. More generally, the transmitting ends 108 are arranged into a scaled version of the cross-sectional shape of the output fiber 30. As shown in FIG. 1, the transmitting ends 108 of the ribbon fiber assembly 100 are held in a standard optical fitting 112 and an imaging lens 34 is arranged between these ends and the system output optical fiber 30, which is held in a fitting 120.

For those cases where the energy must transit a small, convoluted path, the lens 34 images the transmitting end 108 onto the end of the output optical fiber 30. Due to the preceding portion of the system design, the radiation emerges from the transmitting ends 108 with a numerical aperture of 0.087 in both vertical and horizontal planes of the fibers 100. At the beginning of the exemplary system design, it was assumed that the output optical fiber 30 would have a numerical aperture of 0.5 (acceptance angle of 30°). The packing efficiency of the output fiber is maximized if the output numerical aperture of the lens 34 matches the numerical aperture of the fiber 30.

With this choice, the geometrical fractional magnification m of the lens 34 is then the ratio of its input and output numerical apertures or 0.087/0.5=0.174. The area reduction of the image is the magnification squared or $(0.174)^2$= 0.0303. Since the energy is concentrated in an area that is 0.0303 times the original area, the energy density is increased by $(1/m)^2$=1/0.0303=33 times. If the imaginary circle 110 has a diameter of 1600 microns, the image at the optical fiber 30 will have a diameter of 0.174×1600=279 microns. The diffraction limit diameter of this lens is D=1.22λ/N.A.=1.7 microns which is negligible compared to the geometrically predicted diameter. Therefore, the exemplary system design finishes by choosing an output optical fiber 30 that preferably has a numerical aperture of 0.5 and a diameter of 279 microns.

Figure 7:
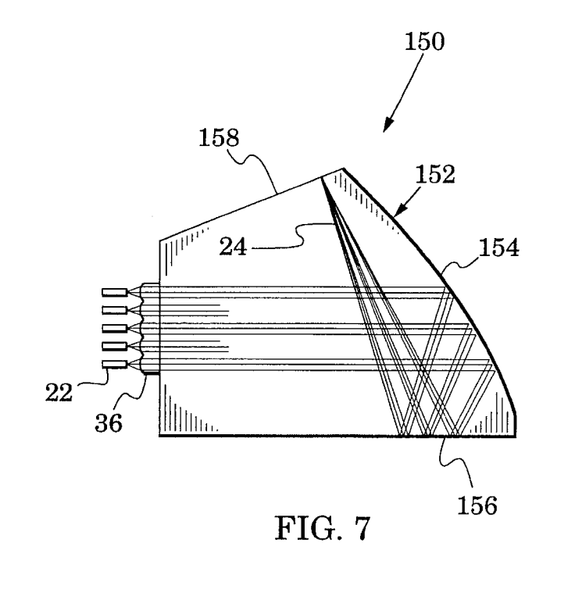
FIG. 7 is a side elevation view of another preferred optical system embodiment.

FIG. 7 is a side elevation view of another preferred optical system embodiment 150 that is similar to the structure shown in FIG. 3, with like elements having like reference numbers. The optical system 150 includes an optical coupler 152 that is similar to the optical coupler 28 of FIG. 3, but which also defines an intermediate reflecting surface 156 spaced from the off-axis parabolic reflecting surface 154 so as to intercept the laser beams 24 before they are brought to focus. In addition, the focal plane 26 of the coupler 28 has been replaced with a focal plane 158 that is positioned above the reflecting surface 156 at the focus of the beams 24. Thus, the optical path has been folded to reduce the system size. For clarity of illustration, only selected laser beams 28 are shown extending all the way to the focal plane 158.

Figures 8, 9:
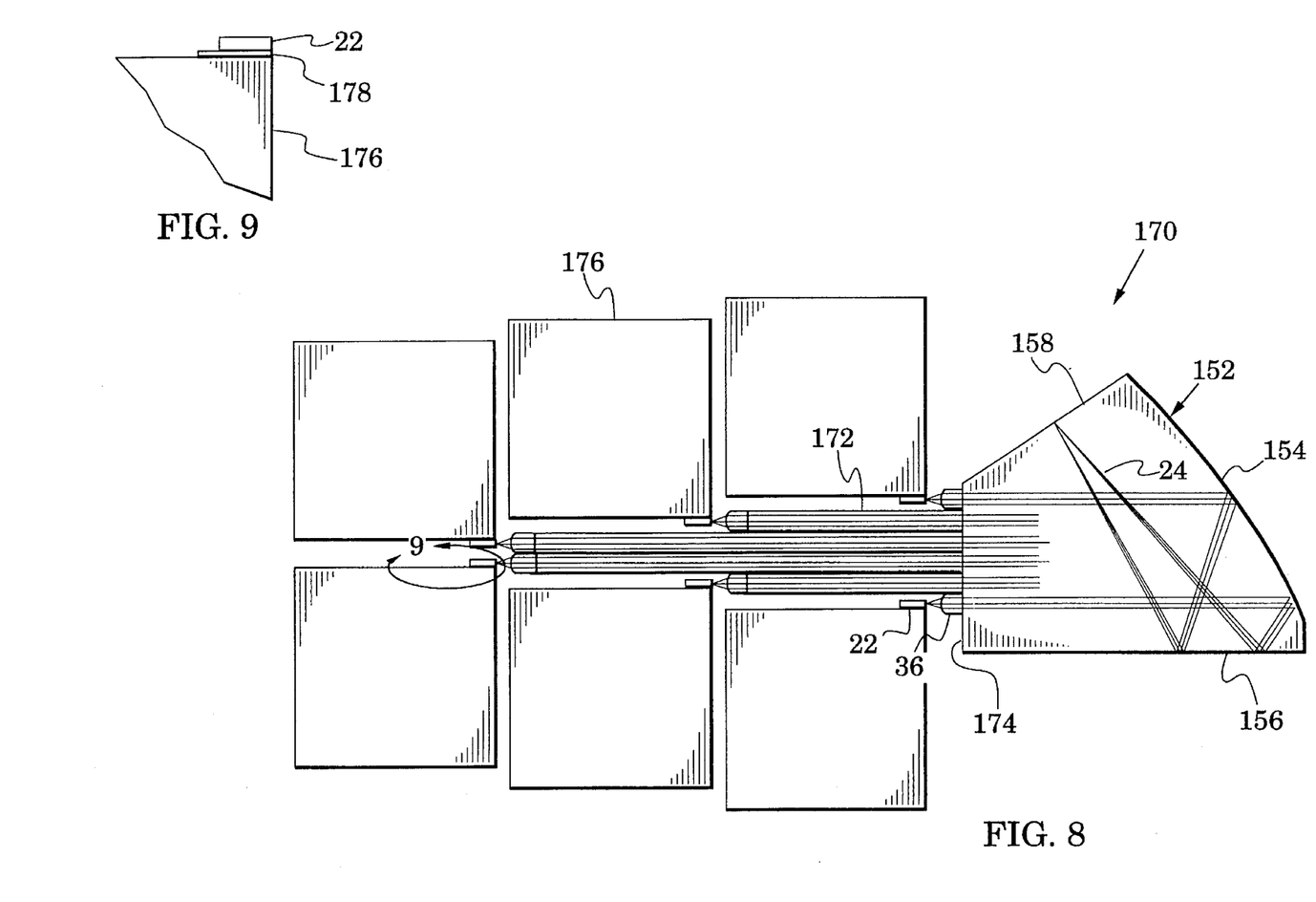
FIG. 8 is a side elevation view of another preferred optical system embodiment.
FIG. 9 is an enlarged view of the structure within the curved line 9 of FIG. 8.

FIG. 8 is a side elevation view of another preferred optical system 170 that is similar to the system 150 of FIG. 7, with like elements having like reference numbers. The optical system 170 has separate collimating lenses 36 that are extended from the coupler 152 by glass extension rods 172. The rods have various lengths which allow the diode bars 22 to be spaced at various distances from the surface 174. Each side of the rods 172 is coated to provide total internal reflection, which reduces power loss between the diode bars 22 and the optical coupler 152. The variation in spacing facilitates the allocation of a separate heat sink 176 to each diode bar 22, which provides a lower resistance heat removal path for the laser diodes. Again, for clarity of illustration, only selected laser beams 28 are shown extending all the way to the focal plane 158.

FIG. 9 is an enlarged view of the structure within the curved line 9 of FIG. 8. This figure illustrates that each diode bar 22 can have a low thermal resistance wafer 178, e.g., diamond, positioned between each diode bar 22 and its heat sink 176 to further lower the resistance of the thermal path.

Figure 10:
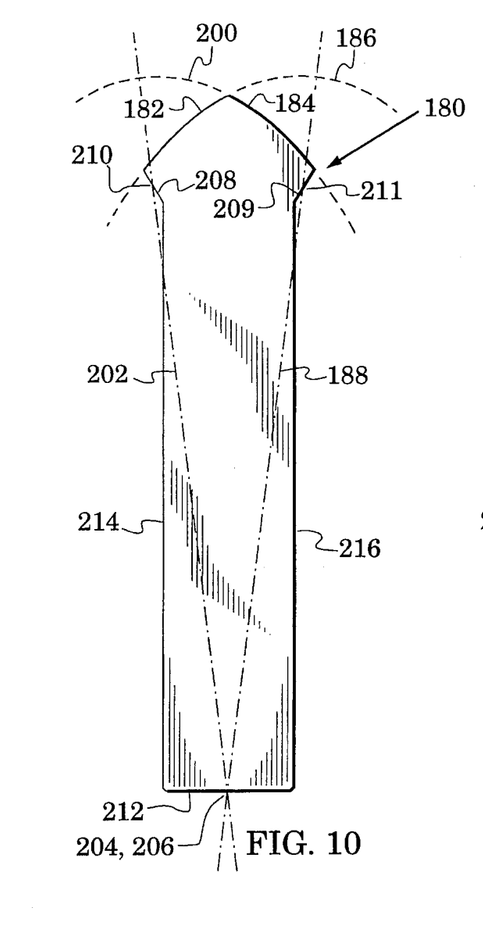
FIG. 10 is a side elevation view of another optical coupler embodiment.

The preferred embodiments described above have generally included lenses and a parabolic mirror for imaging along the fast axial beam plane of laser diode beams. Other embodiments may be formed with the use of structures in accordance with other cylindrical conic sections, e.g., elliptical and hyperbolic. In particular, FIG. 10 is a side elevation view of another preferred coupler embodiment 180 which employs a pair of elliptical mirrors 182, 184. Each of the mirrors is an off-axis segment of an ellipsoidal cylinder. For example, the mirror 182 is a segment of an ellipsoidal cylinder 186 which is indicated by the broken lines in FIG. 10. This ellipsoidal cylinder has an axis 188. Similarly, the mirror 184 is a segment of an ellipsoidal cylinder 200 which has an axis 202. The ellipsoidal cylinders are rotated away from each other with their axes 188, 202 intersecting at the far foci 204, 206 of the cylinders.

Figure 11:
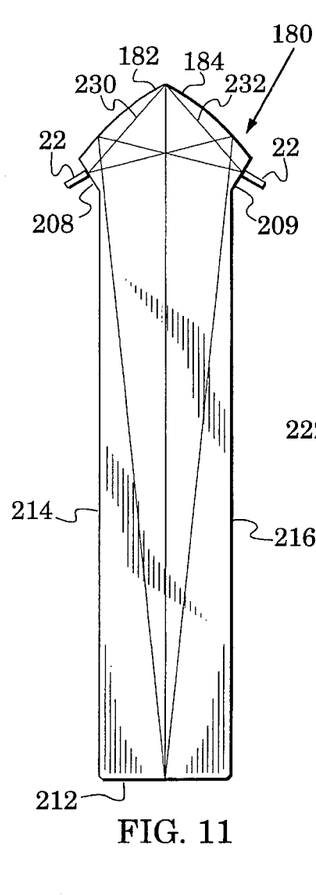
FIG. 11 is view similar to FIG. 10 that includes associated diode bars.
Figure 12:
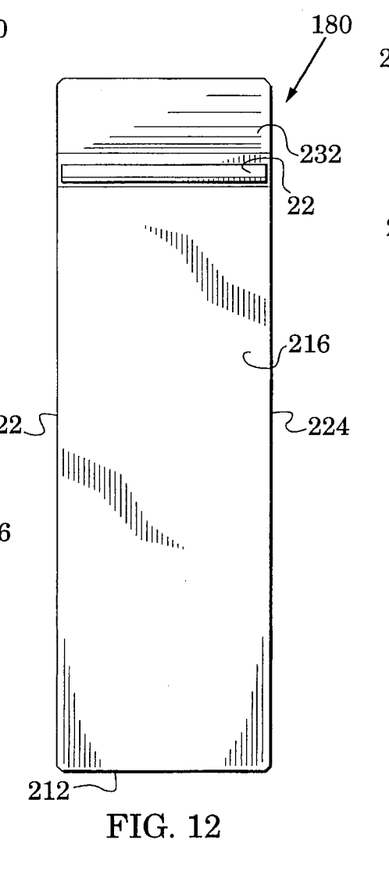
FIG. 12 is a rear elevation view of the coupler of FIG. 11.

The coupler 180 defines a pair of beam entrance planes 208 and 209 that are positioned at the near foci 210, 211 respectively of the ellipsoidal cylinders 200 and 186. The coupler 180 also defines a focal plane 212 that is positioned at the far foci 204, 206. The planes 208, 209 are connected to the focal plane 212 by end walls 214, 216. The coupler 180 is shown again in FIG. 11 with a pair of diode bars 22 arranged to abut the planes 208 and 209 (to allow for thermal expansion, however, it may be preferable to slightly space the diode bars 22 from the coupler). The coupler and diode bars are also illustrated in the rear elevation view of FIG. 12 which shows side walls 222, 224.

In operation, laser beams enter the beam entrance planes 208, 209 with their fast axial beam planes parallel with the side walls 222, 224. The beams are arranged to reflect from the mirrors 182, 184 and come to superimposed images at the focal plane 212. That is, in accordance with the well known properties of ellipsoidal structures, the beams are each imaged along their fast axial beam plane by transit from an entrance focus of an ellipse to a reflecting surface of the ellipse and finally to an exit focus of the same ellipse. To increase energy concentration, the beams are preferably arranged to adjoin as they approach the focal plane 212 as indicated by the exemplary beams 230, 232 in FIG. 11.

Figure 13:
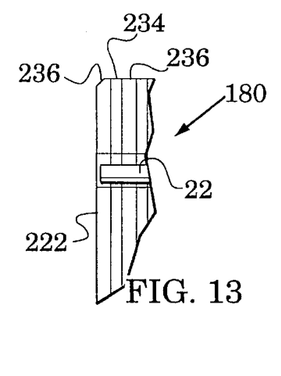
FIG. 13 is a partial rear elevation view of the coupler of FIG. 11 illustrating its laminated structure.

Along their slow axial beam planes, the exemplary beams 230, 232 can be guided to the focal plane 212 by total internal reflection from the side walls 222, 224. However, to further increase energy concentration the coupler 180 can have a laminated structure as shown in FIG. 13 which is a partial rear elevation view of the coupler. FIG. 13 shows a plurality of plates 234 interleaved with spacers 236. Each emitting aperture (44 in FIG. 4C) of the diode bars is aligned with a different one of the plates 234 so that each laser beam is injected into a respective plate 234. The abutting surfaces of the plates 234 and spacers 236 are refractive boundaries that guide the beams down their respective plates 234 to the focal plane by total internal reflection. These refractive boundaries can be realized by forming the spacers 236 from a material of an appropriate refractive index. It may also be realized by the refractive index of another material disposed between the plates 234 and the spacers 236, e.g., a cladding or an adhesive used to bond the plates and spacers together.

With the laminated structure of FIG. 13, each laser beam is received into an optical fiber that is positioned at the focal plane 212 and aligned with that beam's respective plate 234. The laminated structure of FIG. 13 increases packing efficiency in the fibers at the focal plane 212 by limiting the spacing between reflecting surfaces that guide each beam along its slow axial beam plane to substantially the width of the diode aperture that emitted that beam.

In still other preferred embodiments of the invention, the imaging in the fast axial beam plane can be accomplished by replacing the parabolic mirror (38 in FIG. 3) with a cylindrical lens and the guidance along the slow axial beam plane can be accomplished with spaced mirrored surfaces rather than spaced refractive boundaries.

The concentrated power in the output optical fiber 30 of FIG. 1 can be increased by adding additional optical couplers 28 to each receive radiation from additional diode bars 22. The radiation from these added couplers would be transmitted along respective ribbon fiber assemblies as exemplified by the assemblies 32A and 32B which are shown in broken lines in FIG. 1. The transmitting end of all ribbon fiber assemblies would then be combined and arranged as previously described for a single assembly. The transmitting end of the combined ribbon fibers would then occupy a larger diameter pattern, i.e., the circle 110 in FIG. 2C, which would call for a larger diameter output fiber 30.

Although the optical coupler 28 of FIG. 3 has been shown to integrally include the lenses 36, the spaced walls 70, 72, the parabolic mirror 38 and the focal plane 26, it may advantageously to form some of these optical elements separately, e.g., separate lenses 36 may be bonded to the coupler surface 180 in FIG. 3.

From the foregoing it should now be recognized that optical system embodiments have been disclosed herein especially suited for concentrating the energy of multiple laser beams. The preferred embodiments of the invention described herein are exemplary and numerous modifications and rearrangements can be readily envisioned to achieve an equivalent result, all of which are intended to be embraced within the scope of the appended claims.

We claim:

1. A method of concentrating the energy of a plurality of electromagnetic beams that each defines a first numerical aperture and a lesser second numerical aperture respectively along first and second axial beam planes, comprising the steps of:

reducing said first numerical aperture of each of said beams along its first axial beam plane;

reflecting said beams with a concave surface to form a superimposed image at a focus of said concave surface with a combined numerical aperture along their first beam planes;

selecting the focal length of said concave surface to cause said combined numerical aperture to be less than said first numerical aperture; and reflectively guiding each of said beams along its second axial beam plane to retain its second numerical aperture at said focus.

2. The method of claim 1, wherein said combined numerical aperture substantially matches said second numerical aperture.

3. The method of claim 1, wherein said imaging step includes the step of reflecting each of said beams from a different reflective surface wherein each reflective surface has a shape that is defined by a segment of an ellipsoidal cylinder.

4. The method of claim 1, wherein each of said ellipsoidal cylinders has a focus at said focal plane.

5. The method of claim 1, wherein said guiding step includes the step of containing said beam between spaced first and second mirrored boundaries.

6. The method of claim 1, wherein said guiding step includes the step of containing said beam between spaced first and second refractive boundaries.

7. The method of claim 1, wherein said reducing step includes the step of collimating each of said beams along its first axial beam plane and wherein said concave surface is a parabolic surface.

8. A method of concentrating the energy of a plurality of electromagnetic beams that each defines a first numerical aperture and a lesser second numerical aperture respectively along first and second axial beam planes, comprising the steps of:

arranging said beams with their first axial beam planes substantially parallel and their second axial beam planes substantially parallel;

reducing said first numerical aperture of said beams along their first axial beam planes;

reflecting said beams with a concave surface to form a superimposed image at the focus of said concave surface with a combined numerical aperture along their first beam planes;

selecting the focal length of said concave surface to cause said combined numerical aperture to be less than said first numerical aperture; and reflectively guiding said beams along their second axial beam planes to retain their second numerical aperture at said focus.

9. The method of claim 8, wherein said selecting step includes the step of adjusting said focal length to cause said combined numerical aperture to substantially match said second numerical aperture.

10. The method of claim 8, wherein said imaging step includes the step of reflecting said beams from a surface defined by a segment of a conic section.

11. The method of claim 10, wherein said segment of a conic section is an off-axis segment of a parabola.

12. The method of claim 10, wherein said segment of a conic section is an off-axis segment of an ellipse.

13. The method of claim 8 wherein said imaging step includes the steps of:

reducing said first numerical aperture of each of said beams; and reflecting said beams from a surface defined by a segment of a conic section.

14. The method of claim 13, wherein said reducing step includes the step of collimating said beams along their first axial beam planes.

15. The method of claim 8, wherein said guiding step includes the step of containing said beams between first and second refractive boundaries spaced along their second axial beam planes.

16. The method of claim 8, wherein said guiding step includes the step of containing said beams between first and second reflective mirrors spaced along their second axial beam planes.

17. The method of claim 8, further including the step of folding said beams to move said focal plane to a desired position.

18. The method of claim 8, further including the step of positioning entrance ends of a plurality of first optical fibers at said focal plane to receive said beams.

19. The method of claim 18 wherein said combined and second focal plane numerical apertures are substantially matched and further including the step of selecting the numerical aperture of each of said first optical fibers to substantially match said combined and second focal plane numerical apertures.

20. The method of claim 18 wherein said imaging step produces an image and diffraction height at said focal plane and further including the step of selecting a cross-sectional dimension of each of said first optical fibers to substantially match said image and diffraction height.

21. The method of claim 18, further including the steps of:

providing a second optical fiber having a cross-sectional shape;

arranging exit ends of said first optical fibers to define a cross-sectional shape similar to the cross-sectional shape of said second optical fiber; and focusing said exit ends of said first optical fibers onto one end of said second optical fiber.

22. The method of claim 21, wherein:

said focusing step includes the step of selecting a focusing output numerical aperture; and said providing step includes the step of choosing the numerical aperture of said second optical fiber to substantially match said output numerical aperture.

23. The method of claim 21 wherein said focusing step produces an image and diffraction height at said second optical fiber end and further including the step of selecting a cross-sectional dimension of said second optical fiber to substantially match said image and diffraction height.

24. The method of claim 7, wherein said reducing step includes the step of collimating each of said beams along its first axial beam plane and wherein said concave surface is a parabolic surface.

25. An apparatus for concentrating the energy of a plurality of electromagnetic beams that each defines a first numerical aperture and a lesser second numerical aperture respectively along first and second axial beam planes, said beams having their first axial beam planes substantially parallel and their second axial beam planes substantially parallel, comprising:

at least one lens configured to reduce said first numerical aperture of said beams along their first axial beam planes;

a reflective concave surface configured to have a focus and a focal length and arranged to receive said beams from said lens and reflect them along their first axial beam planes to form a superimposed image at said focus with a combined numerical aperture along their first beam planes wherein said concave surface is further configured so that its focal length is sufficient to cause said combined numerical aperture to be less than said first numerical aperture; and first and second reflective guide walls which are substantially parallel and spaced apart to receive said beams therebetween and which are arranged to reflectively guide said beams along their second axial beam planes to retain their second numerical aperture at said focus.

26. The apparatus of claim 25, wherein said combined numerical aperture substantially matches said second numerical aperture.

27. The apparatus of claim 25, wherein said imaging element includes a reflective segment of a conic section.

28. The apparatus of claim 27, wherein said segment of a conic section is an off-axis segment of a parabola.

29. The apparatus of claim 27, wherein said segment of a conic section is an off-axis segment of an ellipse.

30. The apparatus of claim 25, wherein said imaging element includes:

a plurality of lenses configured to reduce said first numerical aperture of said beams; and a reflective surface defined by a segment of a conic section and arranged to receive said beams from said lenses.

31. The apparatus of claim 25, wherein said guide walls comprise refractive boundaries.

32. The apparatus of claim 25, wherein said guide walls comprise reflective mirrors.

33. The apparatus of claim 25, further including a plurality of first optical fibers having entrance ends positioned at said focus to receive said beams.

34. The apparatus of claim 33 wherein said combined and second numerical apertures are substantially matched and the numerical aperture of each of said first optical fibers substantially matches said combined and second numerical apertures.

35. The apparatus of claim 33 wherein said imaging element produces a combined image and diffraction height at said focus and each of said first optical fibers has a cross-sectional dimension that substantially matches said image and diffraction height.

36. The apparatus of claim 33, further including:

a second optical fiber having a cross-sectional shape wherein exit ends of said first optical fibers are arranged to define a cross-sectional shape similar to the cross-sectional shape of said second optical fiber; and a lens arranged to focus said exit ends of said first optical fibers onto an end of said second optical fiber.

37. The apparatus of claim 36, wherein:

said lens is configured to have an output numerical aperture; and said second optical fiber has a numerical aperture substantially matched to said output numerical aperture.

38. The apparatus of claim 36, wherein:

said lens is configured to produce a combined image and diffraction dimension at said second optical fiber end; and said second optical fiber has a cross-sectional dimension substantially matched to said image and diffraction dimension.

39. The method of claim 25, wherein said lens is configured to collimate said beams along their first axial beam planes and said concave surface is a parabolic surface.

40. The apparatus of claim 25, wherein said reflective concave surface is a mirrored concave surface.

41. The apparatus of claim 25, wherein said reflective concave surface is a refractive concave surface.

42. The apparatus of claim 25, wherein said reflective guide walls are mirrored guide walls.

43. The apparatus of claim 25, wherein said reflective guide walls are refractive guide walls.

44. The apparatus of claim 25, further including a reflective surface positioned between said concave surface and its focus and arranged to reflect said superimposed image to a selected location which is spaced from said focus.

* * * * *